(12) United States Patent
Rizzini et al.

(10) Patent No.: US 11,519,932 B2
(45) Date of Patent: Dec. 6, 2022

(54) MEMS INERTIAL SENSOR WITH HIGH RESILIENCE TO THE PHENOMENON OF STICTION

(71) Applicant: STMicroelectronics S.r.l., Agrate Brianza (IT)

(72) Inventors: Francesco Rizzini, Passirano (IT); Gabriele Gattere, Castronno (IT); Sarah Zerbini, Fontanellato (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/192,465

(22) Filed: Mar. 4, 2021

(65) Prior Publication Data

US 2021/0285981 A1 Sep. 16, 2021

(30) Foreign Application Priority Data

Mar. 16, 2020 (IT) .......................... 102020000005563

(51) Int. Cl.
*G01P 15/03* (2006.01)
*B81B 3/00* (2006.01)
(Continued)

(52) U.S. Cl.
CPC .......... *G01P 15/032* (2013.01); *B81B 3/0018* (2013.01); *G01P 15/0802* (2013.01);
(Continued)

(58) Field of Classification Search
CPC ........ G01P 15/125; G01P 15/18; G01P 15/08; G01P 15/0802; G01P 15/032
See application file for complete search history.

(56) References Cited

U.S. PATENT DOCUMENTS

| 8,354,900 B2 | 1/2013 | Cazzaniga et al. |
| 9,604,840 B1 * | 3/2017 | Cheng .................. B81C 1/00238 |

(Continued)

FOREIGN PATENT DOCUMENTS

| DE | 198 13 941 A1 | 10/1999 |
| DE | 10 2012 104 601 A1 | 12/2012 |
| KR | 10-2014-0128706 A | 11/2014 |

OTHER PUBLICATIONS

English Translation For DE 102012104601.*

(Continued)

*Primary Examiner* — Helen C Kwok
(74) *Attorney, Agent, or Firm* — Seed IP Law Group LLP

(57) ABSTRACT

A MEMS inertial sensor includes a supporting structure and an inertial structure. The inertial structure includes at least one inertial mass, an elastic structure, and a stopper structure. The elastic structure is mechanically coupled to the inertial mass and to the supporting structure so as to enable a movement of the inertial mass along a first direction, when the supporting structure is subjected to an acceleration parallel to the first direction. The stopper structure is fixed with respect to the supporting structure and includes at least one primary and one secondary stopper elements. If the acceleration exceeds a first threshold value, the inertial mass abuts against the primary stopper element and subsequently rotates about an axis of rotation defined by the primary stopper element. If the acceleration exceeds a second threshold value, rotation of the inertial mass terminates when the inertial mass abuts against the secondary stopper element.

17 Claims, 10 Drawing Sheets

(51) Int. Cl.
G01P 15/18 (2013.01)
G01P 15/08 (2006.01)
G01P 15/125 (2006.01)

(52) U.S. Cl.
CPC ............ *G01P 15/125* (2013.01); *G01P 15/18* (2013.01); *B81B 2201/0235* (2013.01)

(56) References Cited

U.S. PATENT DOCUMENTS

| | | | |
|---|---|---|---|
| 2004/0079154 A1* | 4/2004 | Yoshikawa | G01P 15/125 73/514.32 |
| 2014/0260613 A1* | 9/2014 | Qiu | G01C 19/5733 73/504.15 |
| 2015/0239731 A1 | 8/2015 | Ahtee et al. | |
| 2016/0084872 A1* | 3/2016 | Naumann | G01P 15/18 73/514.01 |
| 2017/0082519 A1* | 3/2017 | Blomqvist | G01P 15/0802 |
| 2018/0328959 A1 | 11/2018 | Classen et al. | |
| 2019/0162747 A1* | 5/2019 | Thompson | G01P 15/08 |
| 2020/0062584 A1* | 2/2020 | Lehee | B81B 7/0016 |
| 2020/0400712 A1* | 12/2020 | Gattere | B81C 1/00968 |
| 2021/0088545 A1* | 3/2021 | Tang | G01P 1/003 |

OTHER PUBLICATIONS

Pagani et al., "Chipping and wearing in MEMS inertial sensors: effects on stability and predictive analysis through test structures," IEEE, 2020. (4 pages).

* cited by examiner

MEMS INERTIAL SENSOR WITH HIGH RESILIENCE TO THE PHENOMENON OF STICTION

BACKGROUND

Technical Field

The present disclosure relates to a MEMS (MicroElectroMechanical System) inertial sensor with high resilience to the phenomenon of stiction.

Description of the Related Art

As is known, MEMS inertial sensors comprise, for example, accelerometers of a MEMS type, which in turn comprise a suspended inertial mass, which lies in a plane of main extension. Generally, the inertial mass is carried so as to be mobile along a direction (sensing axis) parallel to the plane of main extension, as a result of external accelerations.

For instance, FIGS. 1A and 1B show a known capacitive type of MEMS accelerometer 1 in two different operating conditions. Furthermore, FIGS. 1A and 1B show a Cartesian reference system XYZ, the plane XY of which coincides with the aforementioned plane of main extension.

The MEMS accelerometer 1 comprises an inertial mass 3, of semiconductor material (for example, silicon), which has a planar shape and extends over a substrate not shown in FIGS. 1A and 1B. For instance, the inertial mass 3 has the shape, in top view, of a quadrangular (for example, rectangular) frame and has an opening 9, of a through type. In other words, the inertial mass 3 externally has the shape of a parallelepiped; furthermore, also the opening 9 has the shape of a parallelepiped.

A first electrode and a second electrode 13, 15, both of semiconductor material (for example, silicon) which extend in the opening 9 and are anchored to the underlying substrate by means of respective anchorage portions 13A, 15A. In particular, the first and second electrodes 13, 15 have, in top view, an elongated quadrangular (for example, rectangular) shape, with main extension along the axis X.

In particular, the inertial mass 3 has a first inner surface and a second inner surface 3A, 3B, which laterally delimit the opening 9 and face the first and second electrodes 13, 15, respectively. The first and second inner surfaces 3A, 3B are plane and extend in a direction parallel to the plane XZ.

The MEMS accelerometer 1 has a sensing axis S, which is parallel to the axis Y. Furthermore, the inertial mass 3 has a centroid O, which in resting conditions, is set at a point $d_0$.

In greater detail, in resting conditions of the MEMS accelerometer 1, the first and second inner surfaces 3A, 3B are arranged at a first distance and a second distance $d_1$, $d_2$ from the first and the second electrodes 13, 15, respectively. The first and second surfaces 3A, 3B and, respectively, the first and second electrodes 13, 15 are capacitively coupled to one another and form the plates of corresponding capacitors having capacitances $C_1$, $C_2$, in the resting conditions of the MEMS accelerometer 1.

The inertial mass 3 is traversed throughout its thickness (in a direction parallel to the axis Z) by a plurality of holes 17, which enable, during the manufacturing process, the release of the inertial mass 3.

The inertial mass 3 is coupled to a constraint element 5, fixed with respect to the substrate, by means of a spring element 7 configured to enable a displacement, in particular a translation of the inertial mass 3 along the sensing axis S, in response to an external acceleration $a_{ext}$ having a component directed parallel to the axis Y. In the example of embodiment illustrated, the constraint element 5 is arranged outside the inertial mass 3 and is coupled to a first outer wall 3C of the aforementioned frame shape of the inertial mass 3.

The MEMS accelerometer 1 further comprises a stopper element 19, for example formed by a fixed region extending starting from the substrate, at a distance from the inertial mass 3. In particular, in the example of embodiment illustrated, the stopper element 19 is arranged outside the inertial mass 3 and faces, at a distance, onto a second outer wall 3D of the inertial mass 3, opposite to the first outer wall 3C. In the resting conditions of the MEMS accelerometer 1, illustrated in FIG. 1A, the stopper element 19 is arranged at a stopping distance $d_s$ from the second outer wall 3D of the inertial mass 3.

In use, the inertial mass 3 and the first and second electrodes 13, 15 are biased to respective biasing voltages. For instance, a voltage of approximately 1V is present between the inertial mass 3 and each one of the first and second electrodes 13, 15.

As a result of biasing, the inertial mass 3 is subject to a total electrostatic force $F_{el}$, given by the sum of a first electrostatic force and a second electrostatic force $F_{el1}$, $F_{el2}$. In detail, the first electrostatic force $F_{el1}$ acts between the first electrode 13 and the first inner surface 3A, and the second electrostatic force $F_{el2}$ acts between the second electrode 15 and the second inner surface 3B.

The MEMS accelerometer 1 is designed so that, in resting conditions, the first and second distances $d_1$, $d_2$ between the inertial mass 3 and the first and second electrodes 13, 15 are the same as one another, as likewise the first and second capacitances $C_1$, $C_2$. Therefore, the first and second electrostatic forces $F_{el1}$, $F_{el2}$ are the same, and the total electrostatic force $F_{el}$ is zero. Consequently, in resting conditions, the spring element 7 is undeformed.

In use, assuming that the aforementioned external acceleration $a_{ext}$, acting on the MEMS accelerometer 1, is directed along the sensing axis S (for example, directed downwards, in the plane of the drawing), a translation of the inertial mass 3 occurs along the sensing axis S in a direction opposite to the external acceleration $a_{ext}$, as illustrated in FIG. 1B. Consequently, the distances $d_1$, $d_2$ (and, therefore, the capacitances $C_1$, $C_2$) vary. In particular, the first distance $d_1$ decreases, whereas the second distance $d_2$ increases; furthermore, the first capacitance $C_1$ increases, whereas the second capacitance $C_2$ decreases. These variations of capacitance are indicative of the value of the external acceleration $a_{ext}$, which is thus measured by detecting the variations of the capacitances $C_1$ and $C_2$. For instance, the MEMS accelerometer 1 may be coupled to an ASIC (Application-Specific Integrated Circuit), which provides the corresponding read interface and is configured to generate a signal proportional to the external acceleration $a_{ext}$, as a function of the values of the first and second capacitances $C_1$ and $C_2$.

The translation of the inertial mass 3 is interrupted at the moment when the inertial mass 3 abuts against the stopper element 19 after having covered a distance equal to the stopping distance $d_s$. In this situation, the centroid O of the inertial mass 3 is in a translated position $d_T$, which is translated with respect to the point $d_0$ by an amount equal to the stopping distance $d_s$, in a direction parallel to the sensing axis S. Consequently, the distance between the first electrode 13 and the first inner surface 3A is equal to $d_1-d_s$, whereas the distance between the second electrode 15 and the second inner surface 3B is equal to $d_2+d_s$.

In particular, when the inertial mass 3 abuts against the stopper element 19, it is subjected to a total electrostatic force $F_{el}$ given by Eq. (1):

$$F_{el} = F_{el1} + F_{el2} = \frac{1}{2}\frac{\varepsilon A_{el}}{(d_1 - d_s)^2}\Delta V^2 + \frac{1}{2}\frac{\varepsilon A_{el}}{(d_2 + d_s)^2}\Delta V^2 \quad (1)$$

where c is the dielectric constant, $A_{el}$ is the area of the first and second electrodes 13, 15 (and therefore of the portion of the surfaces 3A, 3B of the inertial mass 3 facing them), and $\Delta V$ is the voltage between the plates of the capacitors $C_1$, $C_2$.

In addition, when the inertial mass 3 abuts against the stopper element 19, a stiction force $F_a$ acts thereon that tends to keep it in abutment against the stopper element 19.

As soon as the external acceleration $a_{ext}$ terminates (i.e., $a_{ext}$=0), an elastic return force $F_m$ exerted by the spring element 7 tends to bring the inertial mass 3 back into the resting position illustrated in FIG. 1A. In particular, the elastic return force $F_m$ acts along the sensing axis S in a direction opposite to the direction of displacement of the inertial mass 3.

The elastic return force $F_m$ is given by Eq. (2):

$$F_m = -k \cdot d_s \quad (2)$$

To overcome the stiction force $F_a$ and bring the inertial mass 3 back into the resting position, so that it is possible to detect further accelerations, the spring element 7 is designed so that the elastic return force $F_m$ is such as to compensate for both the stiction force $F_a$ and for the total electrostatic force $F_{el}$ that has been set up in the step represented in FIG. 1B. In other words, we wish to have $$F_m > \alpha(F_{el} + F_{a(t=0)}) \quad (3)$$

where $F_{a(t=0)}$ is the native stiction force (i.e., the stiction force estimated prior to first use of the MEMS accelerometer 1) and $\alpha$ is a safety coefficient.

However, estimation and compensation of the stiction force $F_a$ are complex. In fact, the stiction force $F_a$ depends upon a large number of tribological aspects linked to the geometry, materials, manufacturing processes, and operating conditions and is moreover variable in time.

In addition, the safety coefficient $\alpha$ in Eq. (3) cannot be set freely and derives from considerations of compromise between the desired performance and the manufacturing costs. In fact, it depends upon constructional and electromechanical parameters of the MEMS accelerometer 1 (such as, the constant k of the spring element 7, the stopping distance $d_s$ between the second outer wall 3D of the inertial mass 3 and the stopper element 19 and the area $A_{el}$ of the electrodes 13, 15). However, the current constructional requirements (such as, for example, requirements of bandwidth, packaging, noise and full scale) do not enable a free choice of the aforesaid constructional parameters, and therefore it is not always possible to maximize the safety coefficient $\alpha$. In particular, the stopping distance $d_s$ is subjected to constraints deriving from the need to have a linear response of the MEMS accelerometer 1, as well as from the shape and arrangement of the opening 9 and of the first and second electrodes 13, 15.

BRIEF SUMMARY

In various embodiments, the present disclosure provides a MEMS inertial sensor that will overcome at least in part the drawbacks of the prior art.

According to one or more embodiments of the present disclosure, a MEMS inertial sensor is provided that includes a supporting structure, an inertial structure including at least one first inertial mass, a first elastic structure, and a first stopper structure. The first elastic structure is mechanically coupled to the first inertial mass and to the supporting structure to enable a movement, with respect to the supporting structure, of the first inertial mass in a direction parallel to a first direction, when the supporting structure is subjected to a first acceleration parallel to said first direction. The first stopper structure is fixed with respect to the supporting structure and includes at least one first primary first-axis stopper element and one first secondary first-axis stopper element. The first primary first-axis stopper element is configured so that, if the first acceleration exceeds a first threshold value, the first inertial mass abuts against the first primary first-axis stopper element and subsequently turns about a first axis of rotation defined by the first primary first-axis stopper element. The first secondary first-axis stopper element is configured so that, if the first acceleration exceeds a second threshold value higher than the first threshold value, the rotation of the first inertial mass terminates when the first inertial mass abuts against the first secondary first-axis stopper element.

In at least one embodiment, a MEMS inertial sensor is provided that includes a supporting structure, an inertial structure including at least one first inertial mass, a first elastic structure, a second elastic structure, and a first stopper structure. The first elastic structure is mechanically coupled to the first inertial mass and to the supporting structure to enable a movement, with respect to the supporting structure, of the first inertial mass in a direction parallel to a first direction, when the supporting structure is subjected to a first acceleration parallel to said first direction. The second elastic structure is elastically coupled to the second inertial mass and to the supporting structure and configured to enable a movement, with respect to the supporting structure, of the second inertial mass in a direction parallel to a second direction, when the supporting structure is subjected to a second acceleration parallel to said second direction. A main-axis electrode is fixed with respect to the supporting structure and capacitively coupled to the first inertial mass to form a corresponding main-axis capacitor, the capacitance of which is indicative of said first acceleration. A transverse-axis electrode is fixed with respect to the supporting structure and capacitively coupled to the second inertial mass to form a corresponding transverse-axis capacitor, the capacitance of which is indicative of said second acceleration. The first stopper structure is fixed with respect to the supporting structure and includes at least one first primary first-axis stopper element and one first secondary first-axis stopper element.

In at least one embodiment, an electronic device is provided that includes a MEMS inertial sensor, an ASIC coupled to the MEMS inertial sensor, and a processing unit coupled to the ASIC. The MEMS inertial sensor includes a supporting structure, an inertial structure including at least one first inertial mass, a first elastic structure, and a first stopper structure. The first elastic structure is mechanically coupled to the first inertial mass and to the supporting structure to enable a movement, with respect to the supporting structure, of the first inertial mass in a direction parallel to a first direction, when the supporting structure is subjected to a first acceleration parallel to said first direction. The first stopper structure is fixed with respect to the supporting structure and includes at least one first primary first-axis stopper element and one first secondary first-axis stopper element. The first primary first-axis stopper element is configured so that, if the first acceleration exceeds a first threshold value, the first inertial mass abuts against the first primary first-axis stopper element and subsequently turns about a first axis of rotation defined by the first primary first-axis stopper element. The first secondary first-axis stopper element is configured so that, if the first acceleration exceeds a second threshold value higher than the first threshold value, the rotation of the first inertial mass terminates when the first inertial mass abuts against the first secondary first-axis stopper element.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1A:
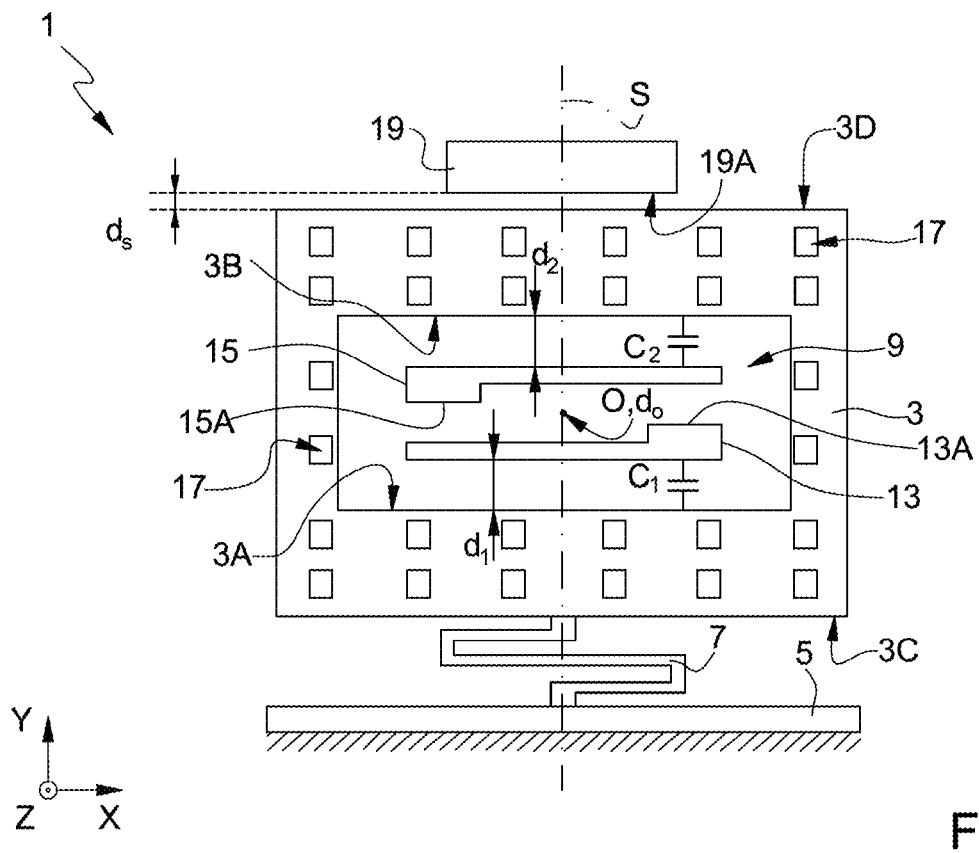
FIGS. 1A and 1B are schematic illustrations in top view of a MEMS inertial sensor of a known type in the resting position and in the presence of an external acceleration, respectively.
Figure 1B:
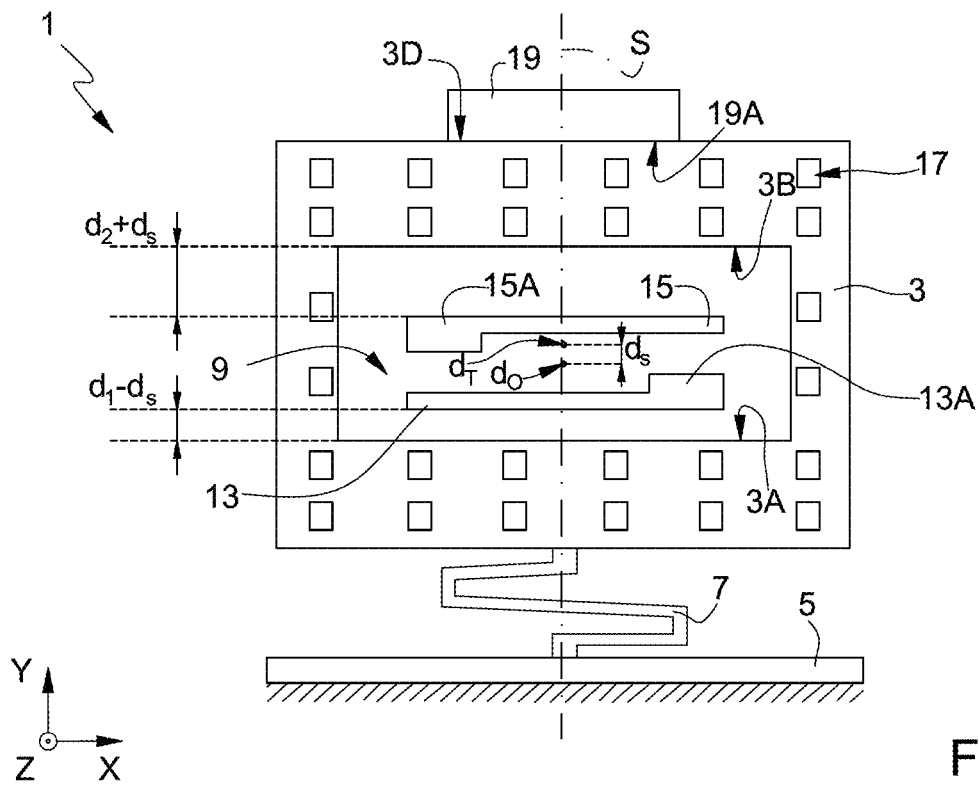
Figure 2:
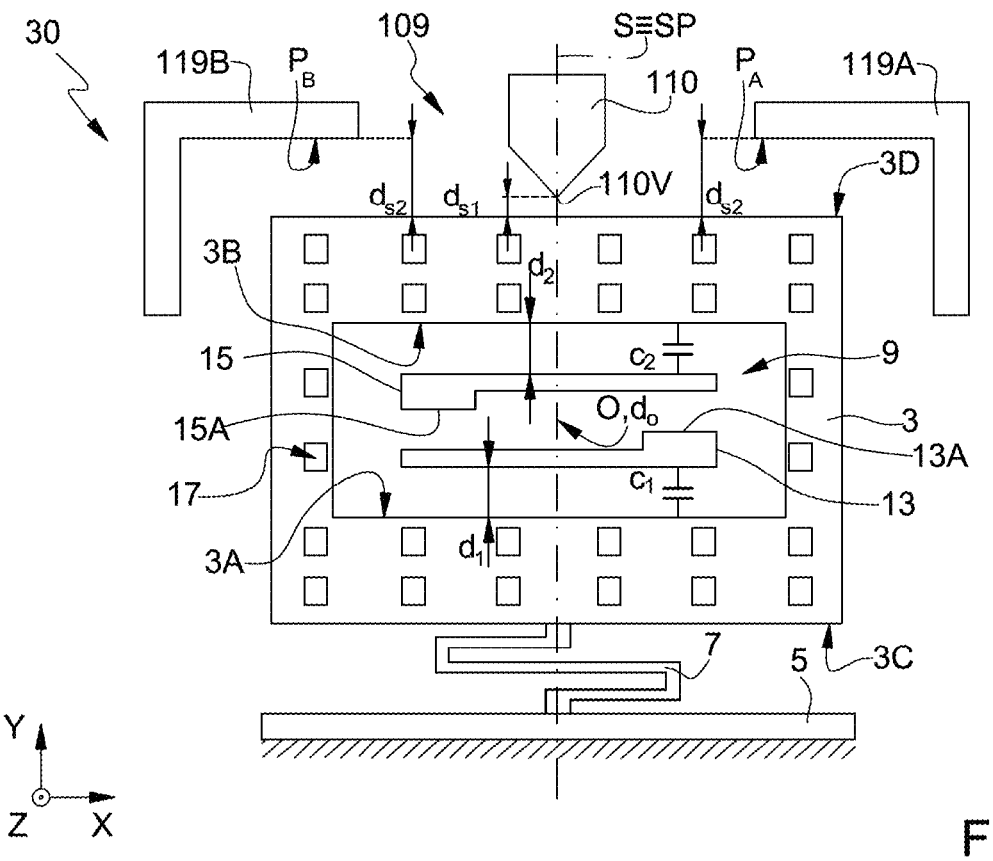
FIG. 2 is a schematic top view of the present MEMS inertial sensor, in resting conditions.

FIG. 2 shows a MEMS inertial sensor, in particular a capacitive type of MEMS accelerometer 30, which is now described with reference to the differences with respect to the MEMS accelerometer 1 illustrated in FIGS. 1A and 1B. The elements already present in the MEMS accelerometer 1 will be designated by the same reference symbols, except where specified otherwise.

Instead of the stopper element 19, the MEMS accelerometer 30 comprises a first stopper structure 109, which includes a primary stopper element 110 and a first secondary and a second secondary stopper element 119A, 119B, which are of semiconductor material and form a single piece with the underlying substrate (not illustrated).

In top view, to a first approximation, the primary stopper element 110 is wedge-shaped, with the vertex facing the second outer wall 3D of the inertial mass 3. In particular, the primary stopper element 110 is delimited by a vertex edge 110V, parallel to the axis Z and lying in a plane parallel to the plane ZY that contains the sensing axis S, referred to in what follows as the plane of symmetry SP.

In resting conditions, the vertex edge 110V is parallel to the second outer wall 3D of the inertial mass 3, from which it is separated by a distance equal to a first stopping distance $d_{s1}$, which is less than the aforementioned first and second distances $d_1$, $d_2$, which are present, in resting conditions, between the inertial mass 3 and, respectively, the first electrode 13 and the second electrode 15.

Without this implying any loss of generality, the first and second secondary stopper elements 119A, 119B have the same shapes as one another and are symmetrical with respect to the plane of symmetry SP. For instance, each of the first and second secondary stopper elements 119A, 119B is L-shaped in top view, with the concavity facing the second outer wall 3D of the inertial mass 3.

In greater detail, the L shape of each the first and second secondary stopper elements 119A, 119B comprises a respective portion having a parallelepipedal shape, which extends in a direction parallel to the second outer wall 3D of the inertial mass 3 and is laterally delimited by a respective side wall (designated, respectively, by $P_A$, in the case of the first secondary stopper element 119A, and by $P_B$, in the case of the second secondary stopper element 119B), which faces onto a corresponding portion of the second outer wall 3D of the inertial mass 3 and is parallel to the plane ZX. In resting conditions, the side walls $P_A$, $P_B$ of the first and second secondary stopper elements 119A, 119B are separated from the second outer wall 3D of the inertial mass 3 by a second stopping distance $d_{s2}$, greater than the first stopping distance $d_{s1}$.

Similarly to what has been mentioned for the MEMS accelerometer 1, also the MEMS accelerometer 30 is designed to detect external accelerations directed parallel to the sensing axis S, and therefore directed parallel to the axis Y.

In use, assuming that the same external acceleration $a_{ext}$ as described for FIG. 1B occurs, and therefore assuming for simplicity that the external acceleration $a_{ext}$ does not have any components along X or along Z, what is described hereinafter occurs.

Figure 3:
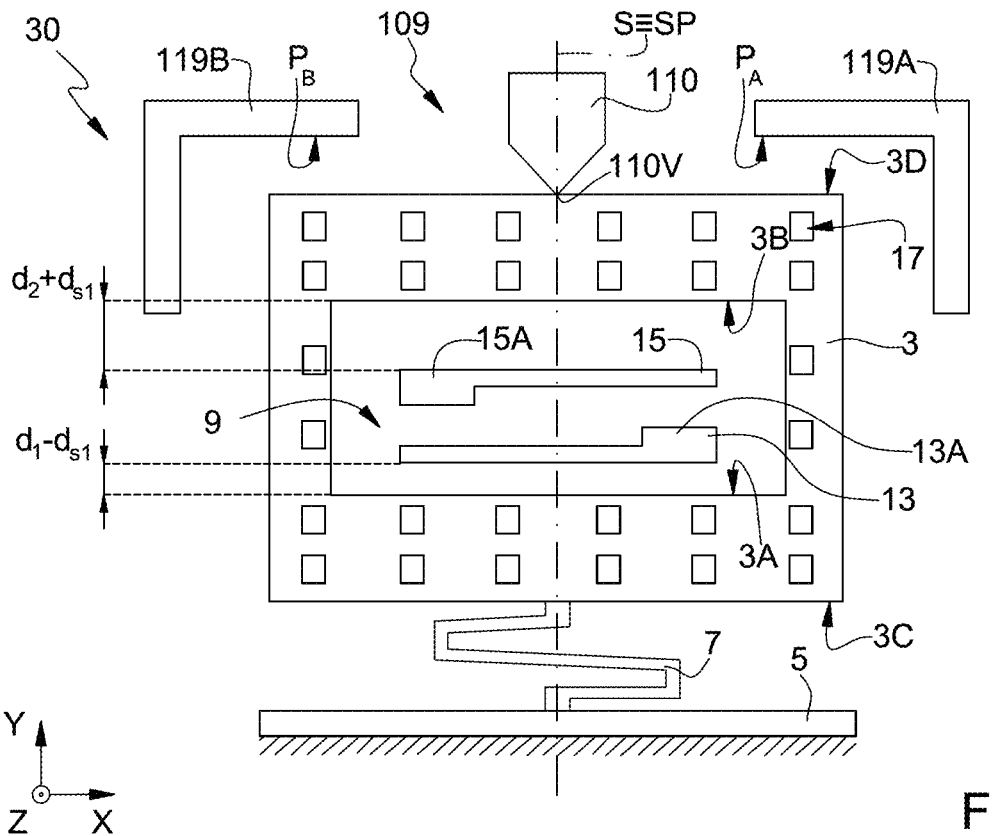
FIGS. 3-5 are schematic top views of the MEMS inertial sensor illustrated in FIG. 2 at successive instants in time, when the MEMS inertial sensor is subjected to an external acceleration.

The inertial mass 3 translates parallel to the sensing axis S in a direction opposite to the external acceleration $a_{ext}$, therefore in the direction of the first stopper structure 109. This translation stops when the inertial mass 3 abuts, namely impacts, against the vertex edge 110V of the primary stopper element 110 (situation illustrated in FIG. 3), namely, after the inertial mass 3 has undergone a displacement along the sensing axis S equal to the first stopping distance $d_{s1}$. Prior to this moment, operation of the MEMS accelerometer 30 is similar to that of the MEMS accelerometer 1 illustrated in FIGS. 1A and 1B.

When the inertial mass 3 impacts against the vertex edge 110V, the spring element 7 is subjected to a first deformation. Furthermore, the inertial mass 3 is still distant from the first and second secondary stopper elements 119A, 119B since, as has been said previously, the second stopping distance $d_{s2}$ is greater than the first stopping distance $d_{s1}$. In these conditions, the considerations made in regard to FIG. 1B apply, except that, instead of the stopping distance $d_s$, reference is made to the first stopping distance $d_{s1}$.

After the inertial mass 3 has impacted against the vertex edge 110V, on the hypothesis that the external acceleration $a_{ext}$ is such that the aforementioned impact is not sufficient to stop the motion of the inertial mass 3, the following occurs.

Figure 4:
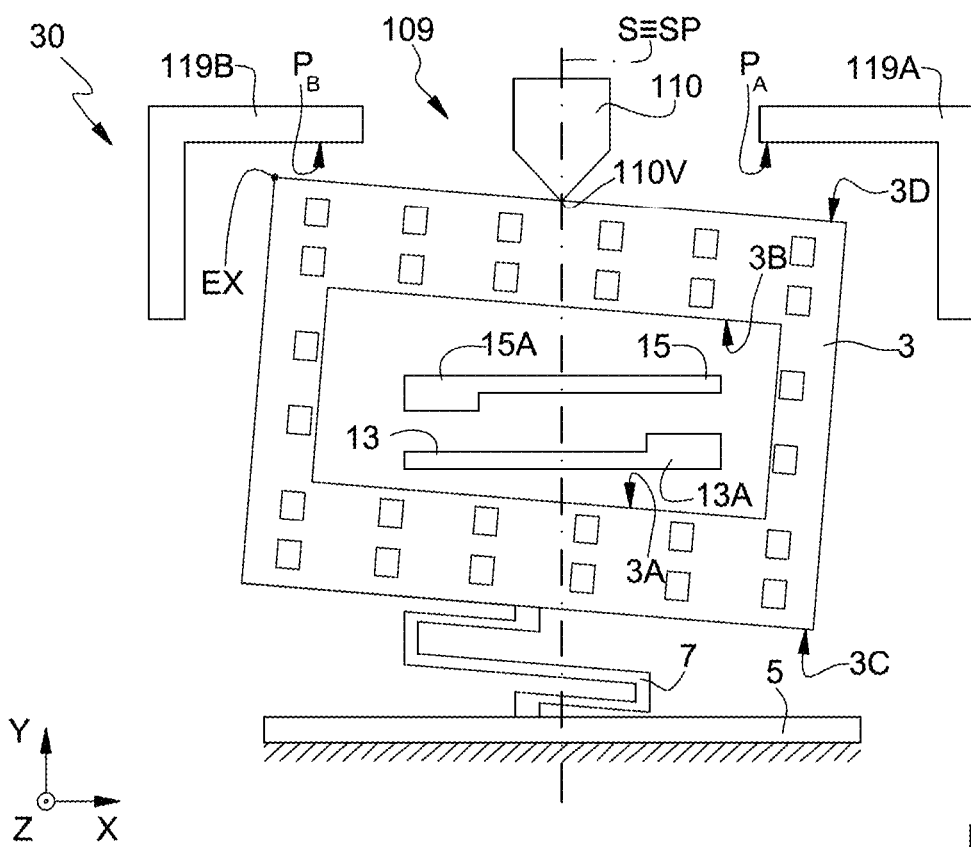

In detail, as illustrated in FIG. 4, the inertial mass 3 starts to rotate about an axis of rotation that coincides with the vertex edge 110V, which functions as center of instantaneous rotation. The rotation occurs in a clockwise or anticlockwise direction, according to the inevitable imperfections that alter the symmetry of the system formed by the spring element 7, the inertial mass 3, and the vertex edge 110V. Alternatively (case not shown), it is possible for the spring element 7 to be configured so that it not only enables translation along the sensing axis S of the inertial mass 3, but also at the same time induces on the inertial mass 3 a simultaneous translation in a direction parallel to the axis Y, by a negligible amount with respect to the translation along the sensing axis S, but sufficient to impose the direction of the subsequent rotation of the inertial mass 3. Furthermore, in the case where the external acceleration $a_{ext}$ has a non-zero component parallel to the axis X, also this component concurs in determining the direction of rotation. In any case, the direction of the rotation of the inertial mass 3 is irrelevant for the purposes of operation of the MEMS accelerometer 30. Purely by way of example, in FIG. 4 it is assumed that the rotation occurs in the clockwise direction.

Figure 5:
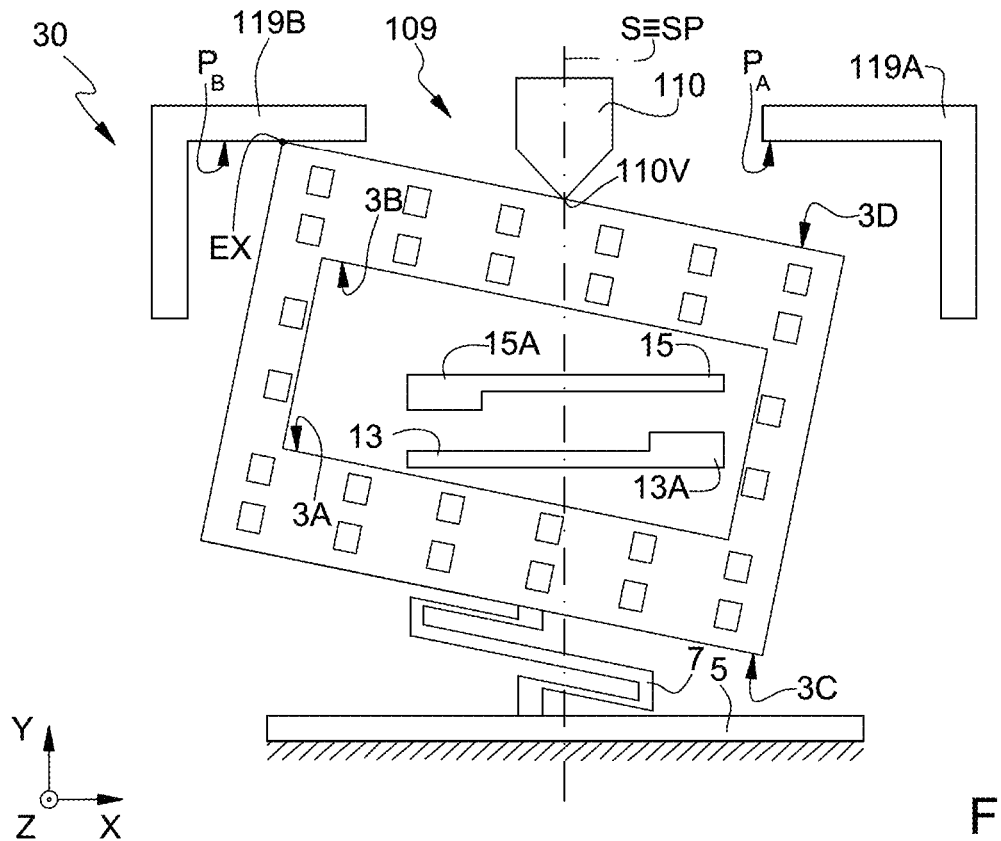

If the external acceleration $a_{ext}$ is sufficiently high, rotation of the inertial mass 3 does not stop until the inertial mass 3 abuts against the side wall $P_B$ of the second secondary stopper element 119B, as shown in FIG. 5. In these conditions, the spring element 7 is subjected to a second deformation, different from the aforementioned first deformation. If the rotation were in the anticlockwise direction, the inertial mass 3 would, instead, come to stop against the side wall $P_A$ of the first secondary stopper element 119A.

In greater detail, and without this implying any loss of generality, contact occurs between the side wall $P_B$ of the second secondary stopper element 119B and a side edge EX of the second outer wall 3D of the external mass 3, parallel to the axis Z. Moreover, the shapes and mutual arrangement of the opening 9 and of the first and second electrodes 13, 15 are such that, during translation and subsequent rotation, the inertial mass 3 remains distant from the first and second electrodes 13, 15; i.e., it does not impact against them. In practice, the arrangement of the primary stopper element 110, and more precisely the first stopping distance $d_{s1}$, determines the full-scale value; i.e., it determines the maximum value of the component of the external acceleration $a_{ext}$ directed parallel to the axis Y that can be properly detected by the MEMS accelerometer 30. In this regard, as mentioned previously, the measurement of the external acceleration $a_{ext}$ may occur in the same way as described with reference to FIGS. 1A and 1B.

In the case where the value of the component of the external acceleration $a_{ext}$ directed parallel to the axis Y exceeds the full-scale value, the aforementioned rotation of the inertial mass 3 occurs about the vertex edge 110V.

The arrangement of the first and second secondary stopper elements 119A, 119B, and more precisely the second stopping distance $d_{s2}$, determines the maximum deformation to which the spring element 7 may be subject, and therefore the maximum value that the component of the external acceleration $a_{ext}$ directed parallel to the axis Y can assume before the protection afforded by the first and second secondary stopper elements 119A, 119B intervenes. In addition, given the same full scale, the aforementioned deformation is such that, in the conditions referred to in FIG. 5, the spring element 7 stores an elastic potential energy greater than the energy that it would store in the case where the primary stopper element 110 were absent. In the latter case, the movement of the inertial mass 3 would stop with the second outer wall 3D of the inertial mass 3 resting against the side walls $P_A$, $P_B$ of the first and second secondary stopper elements 119A, 119B.

Consequently, when the external acceleration $a_{ext}$ terminates, an increase in the elastic return force $F_m$ occurs with respect to what would happen in the absence of the primary stopper element 110. Consequently, the likelihood of the phenomenon of stiction occurring between the inertial mass 3 and the first stopper structure 109 is reduced, and therefore the likelihood of the inertial mass 3 not managing to return into the position occupied in resting conditions is reduced.

In addition, referring to the limit value to indicate the minimum value of the component of the external acceleration $a_{ext}$ directed parallel to the axis Y such that the inertial mass 3 abuts against one of the first and the second secondary stopper elements 119A, 119B, the following occurs. If the value of the component of the external acceleration $a_{ext}$ directed parallel to the axis Y is higher than the full-scale value but lower than the limit value, a reduction in the likelihood of stiction occurs, since the surface of contact between the inertial mass 3 and the primary stopper element 110 is extremely reduced (to a first approximation, it is given by the vertex edge 110V alone), and moreover because a rotation of the inertial mass 3 occurs, which leads to an increase in the elastic potential energy stored by the spring element 7, and therefore an increase in the elastic return force.

Figure 6:
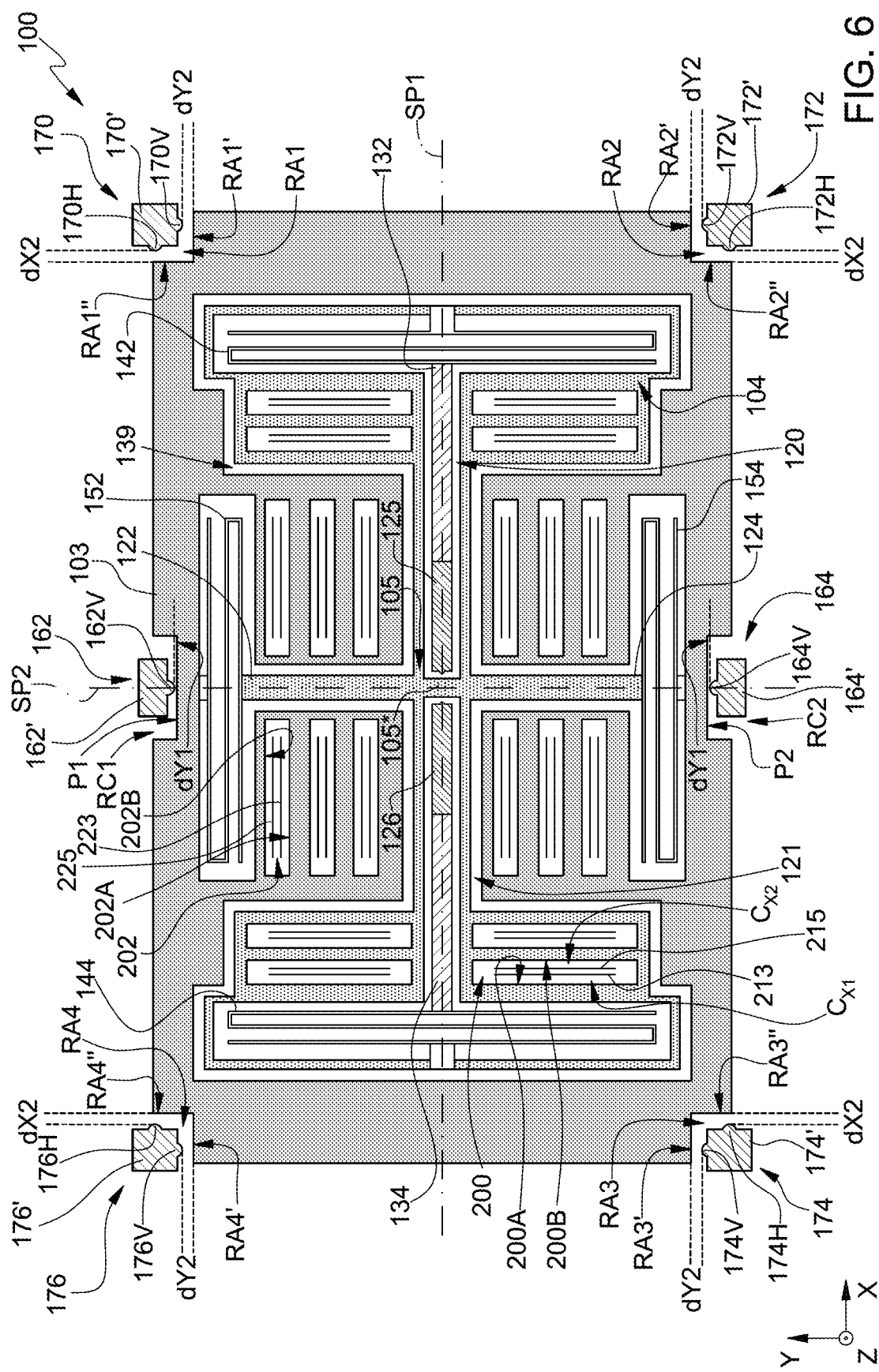
FIG. 6 is a schematic top view of a further embodiment of the present MEMS inertial sensor, in resting conditions.

FIG. 6 shows a further embodiment. In particular, FIG. 6 shows a MEMS accelerometer 100, of the type with two sensing axes.

In detail, the MEMS accelerometer 100 comprises a first inertial mass and a second inertial mass 103, 104, which to a first approximation have a planar structure, with main dimensions parallel to the plane XY and negligible thickness along the axis Z. The first and second inertial masses 103, 104 extend on a substrate not visible in FIG. 6. The substrate and the first and second inertial masses 103, 104 are of semiconductor material (for example, silicon).

The first inertial mass 103 laterally delimits a main opening 139, inside which the second inertial mass 104 extends, which is therefore laterally surrounded by the first inertial mass 103. Without this implying any loss of generality, in top view the main opening 139 has a symmetrical shape both with respect to a first plane of symmetry SP1, parallel to the plane XZ, and with respect to a second plane of symmetry SP2, parallel to the plane ZY.

The second inertial mass 104 occupies an outer portion of the main opening 139 and laterally delimits a first secondary opening 120 and a second secondary opening 121, which are portions of the main opening 139 and have, in top view, shapes that are the same as and symmetrical with respect to the second plane of symmetry SP2.

More in particular, the second inertial mass 104 comprises a respective central body 105, which laterally delimits the first and second secondary openings 120, 121, and a first vertical arm 122 and a second vertical arm 124, which have shapes of parallelepipeds elongated in a direction parallel to the axis Y. Moreover, the first and second vertical arms 122, 124 are the same as one another and symmetrical, with respect to the first plane of symmetry SP1, and extend on opposite sides of the central body 105, with which they form a single piece. In particular, the first and second vertical arms 122, 124 extend starting from the central body 105 towards the first inertial mass 103. Even more in particular, each one of the first and second vertical arms 122, 124 has a proximal end, which is fixed to the central body 105, and a distal end, to which reference will be made hereinafter.

The MEMS accelerometer 100 further comprises a first anchorage region 125 and a second anchorage region 126, which extend, respectively, in the first and second secondary openings 120, 121 and are fixed to the underlying substrate, with which they form a single piece. The first and second anchorage regions 125, 126 are therefore formed of semiconductor material and have shapes (for example, of parallelepipeds elongated in a direction parallel to the axis X) that are the same and are symmetrical with respect to the second plane of symmetry SP2. Furthermore, referring to central region 105* to indicate the portion of the central body 105 interposed between the first and second secondary openings 120, 121, each one of the first and second anchorage regions 125, 126 has a first end facing the central region 105* and a second end facing in an opposite direction, as described in greater detail hereinafter. The proximal ends of the first and second vertical arms 122, 124 are fixed to the central region 105* of the central body 105.

The MEMS accelerometer 100 further comprises a first horizontal arm 132 and a second horizontal arm 134, which have the shape of parallelepipeds elongated in a direction parallel to the axis X, overlie at a distance the substrate and are the same as one another and symmetrical with respect to the second plane of symmetry SP2. In addition, the first and second horizontal arms 132, 134 extend, respectively, within the first and second secondary openings 120, 121.

More in particular, the first and second horizontal arms 132, 134 are formed of semiconductor material and form a single piece with the first and second anchorage regions 125, 126, respectively. Even more in particular, each one of the first and second horizontal arms 132, 134 has a respective first end and a respective second end. The first end of the first and second horizontal arms 132, 134 are fixed, respectively, to the second end of the first anchorage region 125 and to the second end of the second anchorage region 126.

The MEMS accelerometer 100 further comprises a first spring element 142 and a second spring element 144, which are of a folded type, with a serpentine shape in top view, and are compliant in a direction parallel to the axis X. Moreover, the first and second spring elements 142, 144 have a negligible thickness in a direction parallel to the axis Z. In addition, the first and second spring elements 142, 144 are the same as one another and symmetrical with respect to the second plane of symmetry SP2.

In detail, the first and second spring elements 142, 144 extend, respectively, inside the first and second secondary openings 120, 121 so that the first horizontal arm 132 is interposed between the first anchorage region 125 and the first spring element 142, while the second horizontal arm 134 is interposed between the second anchorage region 126 and the second spring element 144.

In greater detail, the first spring element 142 has a first end and a second end, which are fixed, respectively, to the second end of the first horizontal arm 132 and to a first point of the second inertial mass 104. The second spring element 144 has a respective first end and a respective second end, which are fixed, respectively, to the second end of the second horizontal arm 134 and to a second point of the second inertial mass 104. The first and second points of the second inertial mass 104 are symmetrical with respect to the second plane of symmetry SP2. Furthermore, the first and second points of the second inertial mass 104 are aligned along the direction of elongation of the first and second horizontal arms 132, 134.

The MEMS accelerometer 100 further comprises a third spring element 152 and a fourth spring element 154, which are of a folded type, with a serpentine shape in top view, and are compliant in a direction parallel to the axis Y. Also the third and fourth spring elements 152, 154 have a negligible thickness in a direction parallel to the axis Z. Furthermore, the third and fourth spring elements 152, 154 are the same as one another and symmetrical with respect to the first plane of symmetry SP1.

In detail, the third and fourth spring elements 152, 154 are arranged in the main opening 139, between the first and second inertial masses 103, 104.

In greater detail, the third spring element 152 has a respective first end and a respective second end, which are, respectively, fixed to the distal end of the first vertical arm 122 and to a first point of the first inertial mass 103. The fourth spring element 154 has a respective first end and a respective second end, which are fixed, respectively, to the distal end of the second vertical arm 124 and to a second point of the first inertial mass 103. The first and second points of the first inertial mass 103 are symmetrical with respect to the first plane of symmetry SP1; moreover, the first and second points of the first inertial mass 103 are aligned in the direction of elongation of the first and second vertical arms 122, 124.

In greater detail, the first inertial mass 103 externally has the shape of a parallelepiped except for the presence of a first central recess and a second central recess RC1, RC2 and a first, a second, a third and a fourth angular recess RA1, RA2, RA3, RA4.

The first and second central recesses RC1, RC2 have parallelepipedal shapes that are the same as one another and are symmetrical with respect to the first plane of symmetry SP1, and are also aligned along the direction of elongation of the first and second vertical arms 122, 124. In addition, the first and second central recesses RC1, RC2 are laterally delimited, respectively, by a first and a second outer side wall P1, P2, which in resting conditions are parallel to the plane ZX.

The first, second, third and fourth corner recesses RA1, RA2, RA3, RA4 form corresponding indents arranged along the side edges of the first inertial mass 103.

In particular, each one of the first, second, third and fourth corner recesses RA1, RA2, RA3, RA4 is delimited by a corresponding pair of walls, which include: a corresponding horizontal peripheral wall, which in resting conditions is parallel to the plane XZ and is designated by the same reference symbol with the addition of a prime symbol; and a corresponding vertical peripheral wall, which in resting conditions is parallel to the plane YZ and is designated by the same reference symbol with the addition of a second-prime symbol. In each one of the first, second, third and fourth corner recesses RA1, RA2, RA3, RA4, the corresponding horizontal peripheral wall and the corresponding vertical peripheral wall are connected to one another at right angles.

The MEMS accelerometer 100 further comprises a first and a second external primary stopper element 162, 164 and a first, a second, a third and a fourth secondary stopper element 170, 172, 174, 176, which are of semiconductor material, extend on the outside of the first inertial mass 103 and are fixed to the underlying substrate, with which they form a single piece.

Each one of the first and second external primary stopper elements 162, 164 and the first, second, third and fourth secondary stopper elements 170, 172, 174, 176 has a respective body (designated by the corresponding reference number, with the addition of a prime symbol), which has, for example, the shape of a parallelepiped with its base fixed to the substrate.

The first and second external primary stopper elements 162, 164 are the same as one another and symmetrical with respect to the first plane of symmetry SP1. Moreover, each one of the first and second external primary stopper elements 162, 164 comprises a respective projecting region (designated by the corresponding reference number, with the addition of the letter V), which departs from the corresponding body, towards the first inertial mass 103.

The bodies 162', 164' of the first and second external primary stopper elements 162, 164 extend at least in part within the first and second central recesses RC1, RC2, respectively. The projecting regions 162V, 164V of the first and second external primary stopper elements 162, 164 extend, respectively, within the first and second central recesses RC1, RC1 so that the projecting region 162V of the first external primary stopper element 162 extends between the corresponding body 162' and the first inertial mass 103, while the projecting region 164V of the second external primary stopper element 164 extends between the corresponding body 164' and the first inertial mass 103.

In greater detail, the projecting region 162V of the first external primary stopper element 162 is fixed at the bottom to the substrate and extends starting from the body 162' towards the first outer side wall P1 of the first central recess RC1, which it faces, at a distance. In particular, in resting conditions, the projecting region 162V of the first external primary stopper element 162 is separated from the first outer side wall P1 by a distance dY1. The projecting region 164V of the second external primary stopper element 164 is fixed, at the bottom, to the substrate and extends starting from the body 164' towards the second outer side wall P2 of the second central recess RC2, which it faces, at a distance. To a first approximation, in resting conditions, the projecting region 164V of the second external primary stopper element 164 is separated from the second outer side wall P2 by the aforementioned distance dY1.

Without this implying any loss of generality, the projecting regions 162V, 164V of the first and second external primary stopper elements 162, 164 have a beveled shape, which approximately resembles a semi-cylinder with axis parallel to the axis Z and with a diameter (in top view) in contact with the corresponding body 162', 164'.

The bodies 170', 162', 174', 176' of the first, second, third and fourth secondary stopper elements 170, 172, 174, 176 extend at least in part inside the first, second, third and fourth corner recesses RA1, RA2, RA3, RA4, respectively. In addition, each of the first, second, third and fourth secondary stopper elements 170, 172, 174, 176 comprises a respective first projecting region (designated by the corresponding reference symbol, with the addition of the letter V) and a respective second projecting region (designated by the corresponding reference, with the addition of the letter H). The first and second projecting regions 170V-176V, 170H-176H of the first, second, third and fourth secondary stopper elements 170, 172, 174, 176 extend, respectively, within the first, second, third and fourth corner recesses RA1, RA2, RA3, RA4.

Without this implying any loss of generality, the first and second projecting regions 170V-176V, 170H-176H each have a beveled shape, which approximately resembles a semi-cylinder with axis parallel to the axis Z and with diameter (in top view) in contact with the corresponding body 170'-176'.

In greater detail, the first projecting regions 170V, 172V, 174V, 176V extend, respectively, starting from the bodies 170', 172', 174', 176' of the first, second, third and fourth secondary stopper elements 170, 172, 174, 176, respectively, in the direction of the horizontal peripheral walls RA1', RA2', RA3', RA4' of the first, second, third and fourth corner recesses RA1, RA2, RA3, RA4, from which in resting conditions they are separated, respectively, by a same distance dY2, which is greater than the distance dY1.

The second projecting regions 170H, 172H, 174H, 176H extend, respectively, from the bodies 170', 172', 164', 176' of the first, second, third and fourth secondary stopper elements 170, 172, 174, 176, respectively, in the direction of the vertical peripheral walls RA1", RA2", RA3", RA4" of the first, second, third and fourth corner recesses RA1, RA2, RA3, RA4, from which they are respectively separated, in resting conditions, by a same distance dX2.

Without this implying any loss of generality, and to a first approximation, the first and second secondary stopper elements 170, 172 are the same as one another and symmetrical with respect to the first plane of symmetry SP1, as likewise the third and fourth secondary stopper elements 174, 176. In addition, the first and fourth secondary stopper elements 170, 176 are the same as one another and symmetrical with respect to the second plane of symmetry SP2, as likewise the second and third secondary stopper elements 172, 174.

Figure 7:
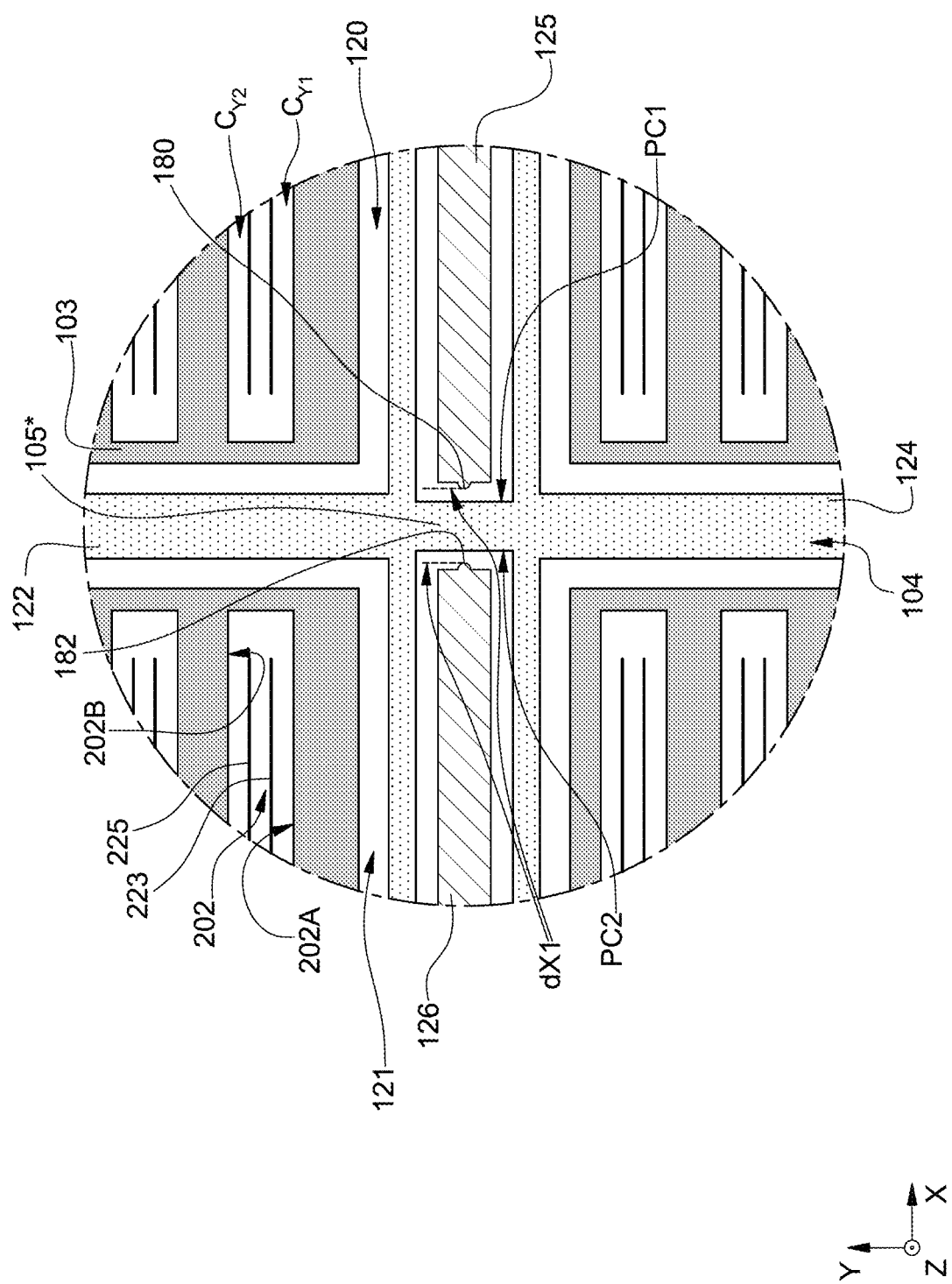
FIG. 7 shows an enlargement of a portion of FIG. 6.

As illustrated in greater detail in FIG. 7, the MEMS accelerometer 100 further comprises a first and a second internal primary stopper element 180, 182, which are formed of semiconductor material.

In detail, the central region 105* of the second inertial mass 104 extends, as explained previously, between the first and second secondary openings 120, 121. Furthermore, the central region 105* is laterally delimited by a first wall PC1 and a second wall PC2, referred to in what follows as the first inner wall PC1 and the second inner wall PC2. In resting conditions, the first and second inner walls PC1, PC2 are parallel to the plane YZ and symmetrical with respect to the second plane of symmetry SP2.

This having been said, the first and second internal primary stopper elements 180, 182 are fixed to the underlying substrate. In addition, the first internal primary stopper element 180 extends laterally starting from the first end of the first anchorage region 125, in the direction of the first inner wall PC1, from which it is separated, in resting conditions, by a distance dX1, which is shorter than the distance dX2. The second internal primary stopper element 182 extends laterally starting from the first end of the second anchorage region 126, in the direction of the second inner wall PC2, from which it is separated, in resting conditions, by the distance dX1.

Without this implying any loss of generality, the first and second internal primary stopper elements 180, 182 are the same as one another and symmetrical with respect to the second plane of symmetry SP2. Furthermore, the first and second internal primary stopper elements 180, 182 have a beveled shape, which approximately resembles a semi-cylinder with axis parallel to the axis Z and with a diameter (in top view) in contact with the corresponding body 125, 126.

Moreover present within the second inertial mass 104 is a plurality of first additional openings 200, which have shapes that are the same as one another and traverse the central body 105 of the second inertial mass 104 so as to face onto the underlying substrate. Purely by way of example, in the embodiment illustrated in FIG. 7 eight first additional openings 200 are present, divided into two groups of four and having, for example, the shape of parallelepipeds elongated (in resting conditions) in a direction parallel to the axis Y. The two groups have an arrangement symmetrical with respect to the second plane of symmetry SP2; moreover, in each group, the corresponding four first additional openings 200 are arranged in two pairs, each of which comprises two first additional openings 200 aligned in a direction parallel to the axis X, the two pairs of the group being the same as one another and symmetrical with respect to the first plane of symmetry SP1.

Moreover present within the first inertial mass 103 is a plurality of second additional openings 202, which have shapes that are the same as one another and traverse the first inertial mass 103 so as to face onto the underlying substrate. Purely by way of example, present in the embodiment illustrated in FIG. 7 are twelve second additional openings 202, divided into two groups of six and having, for example, the shape of parallelepipeds elongated (in resting conditions) in a direction parallel to the axis X. The two groups have an arrangement symmetrical with respect to the first plane of symmetry SP1; moreover, in each group, the corresponding six second additional openings 202 are arranged in triplets, each of which comprises three second additional openings 200 aligned in a direction parallel to the axis Y, the two triplets of the group being the same as one another and symmetrical with respect to the second plane of symmetry SP2.

Present within each first additional opening 200 and each second additional opening 202 is a corresponding first electrode (designated, respectively, by 213, in the case of the first additional openings 200, and by 223, in the case of the second additional openings 202) and a corresponding second electrode (designated, respectively, by 215 in the case of the first additional openings 200, and 225 in the case of the second additional openings 202), which are formed of semiconductor material (for example, silicon) and are anchored to the underlying substrate.

In addition, in each first additional opening 200, the corresponding first electrode 213 and the corresponding second electrode 215 form, with a first and a second inner surface 200A, 200B of the first additional opening 200, a first and a second variable capacitor $C_{X1}$, $C_{X2}$, respectively, in a way similar to what has been described with reference to FIGS. 1A to 5. In resting conditions, the first and second inner surfaces 200A, 200B are parallel to the plane ZY.

Likewise, in each second additional opening 202, the corresponding first electrode 223 and the corresponding second electrode 225 form, with a first and a second inner surface 202A, 202B of the second additional opening 202, a corresponding first and second variable capacitor $C_{Y1}$, $C_{Y2}$, respectively, in a way similar to what has been described with reference to FIGS. 1A to 5. In resting conditions, the first and second inner surfaces 202A, 202B are parallel to the plane ZX.

In use, assuming that the external acceleration $a_{ext}$, to which the substrate is subjected, is directed parallel to the axis X and has a direction opposite to the direction of the axis X illustrated in FIG. 6, the following occurs.

The second inertial mass 104 translates to the right (in the plane of FIG. 6), together with the first inertial mass 103, since the third and fourth spring elements 152, 154 are rigid in a direction parallel to the axis X, with consequent deformation of the first spring element 142, which lengthens, and of the second spring element 144, which is compressed.

Figure 8:
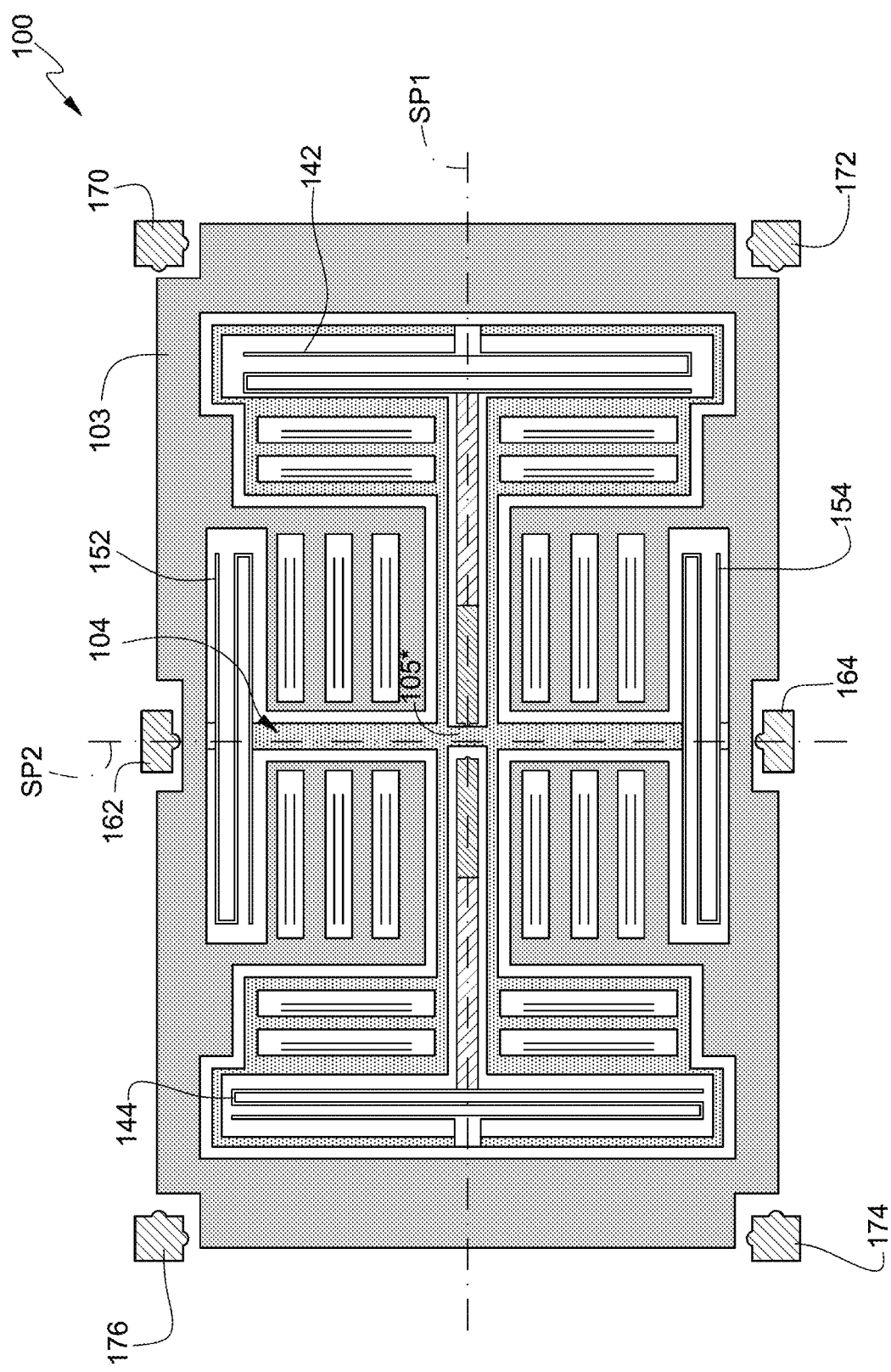
FIGS. 8 and 9 are schematic top views of the embodiment illustrated in FIGS. 6-7, when subjected to a first acceleration.

On the hypothesis of the modulus of the external acceleration $a_{ext}$ being sufficiently high, i.e., exceeding a first threshold value, the translation proceeds until the first inner wall PC1 of the second inertial mass 104 abuts against the first internal primary stopper element 180, as illustrated in FIG. 8.

Figure 9:
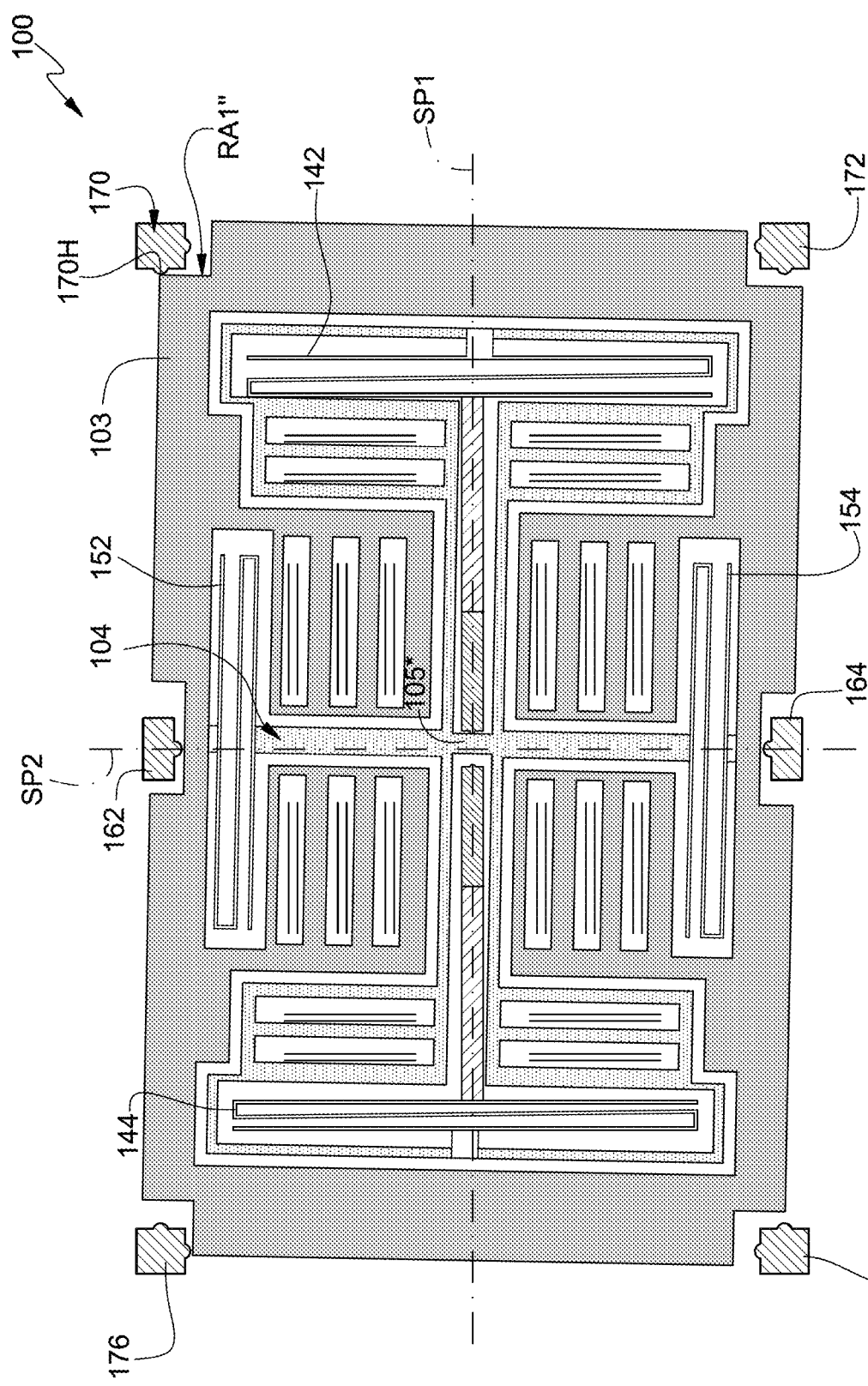

The first internal primary stopper element 180 functions as center of rotation for the ensemble formed by the first and second inertial masses 103, 104 and by the third and fourth spring elements 152, 154, which rotate in a way fixed with respect to one another. As regards the direction of rotation, the considerations made in connection with FIG. 4 apply; for example, in what follows it is assumed that the rotation occurs in the clockwise direction. Furthermore, if the modulus of the external acceleration $a_{ext}$ exceeds a second threshold value higher than the first threshold value, the rotation terminates when, as shown in FIG. 9, the second inertial mass 104 abuts against at least one of the first, second, third and fourth secondary stopper elements 170, 172, 174, 176. In particular, in FIG. 9 it is assumed that the dimensions of the MEMS accelerometer 100 are such that the vertical peripheral wall RA1" abuts against the second projecting region 170H. The first inertial mass 103 remains in any case at a distance from the first and second external primary stopper elements 162, 164.

As discussed with reference to FIGS. 4 and 5, the aforementioned rotation leads to an increase of the elastic potential energy stored in the first and second spring elements 142, 144, with consequent increase in the elastic return force $F_m$, and therefore reduction in the likelihood of the phenomenon of stiction occurring between the first inertial mass 103 and the first secondary stopper element 170.

Similar considerations apply in the case (not illustrated) where the external acceleration $a_{ext}$, in addition to being directed parallel to the axis X, has a direction concordant with the axis X. In this case, should the modulus of the external acceleration $a_{ext}$ exceed a corresponding first threshold value, the rotation of the first and second inertial masses 103, 104 in a way fixed occurs about the second internal primary stopper element 182. In addition, in the case where the modulus of the external acceleration $a_{ext}$ exceeds a corresponding second threshold value, and assuming, for example, that the rotation occurs in an anticlockwise direction, the first inertial mass 103 abuts against the second projecting region 176H.

In the case where, instead, the external acceleration $a_{ext}$ is directed parallel to the axis Y and has a direction opposite to the direction of the axis Y illustrated in FIG. 6, the following occurs.

The second inertial mass 104 remains stationary with respect to the substrate since the first and second spring elements 142, 144 are rigid in a direction parallel to the axis Y. Instead, the first inertial mass 103 translates upwards (in the plane of FIG. 6), since the third and fourth spring elements 152, 154 are compliant in a direction parallel to the axis Y. In particular, translation of the first inertial mass 103 causes deformation of the third spring element 152, which lengthens, and of the fourth spring element 154, which is compressed.

Figure 10:
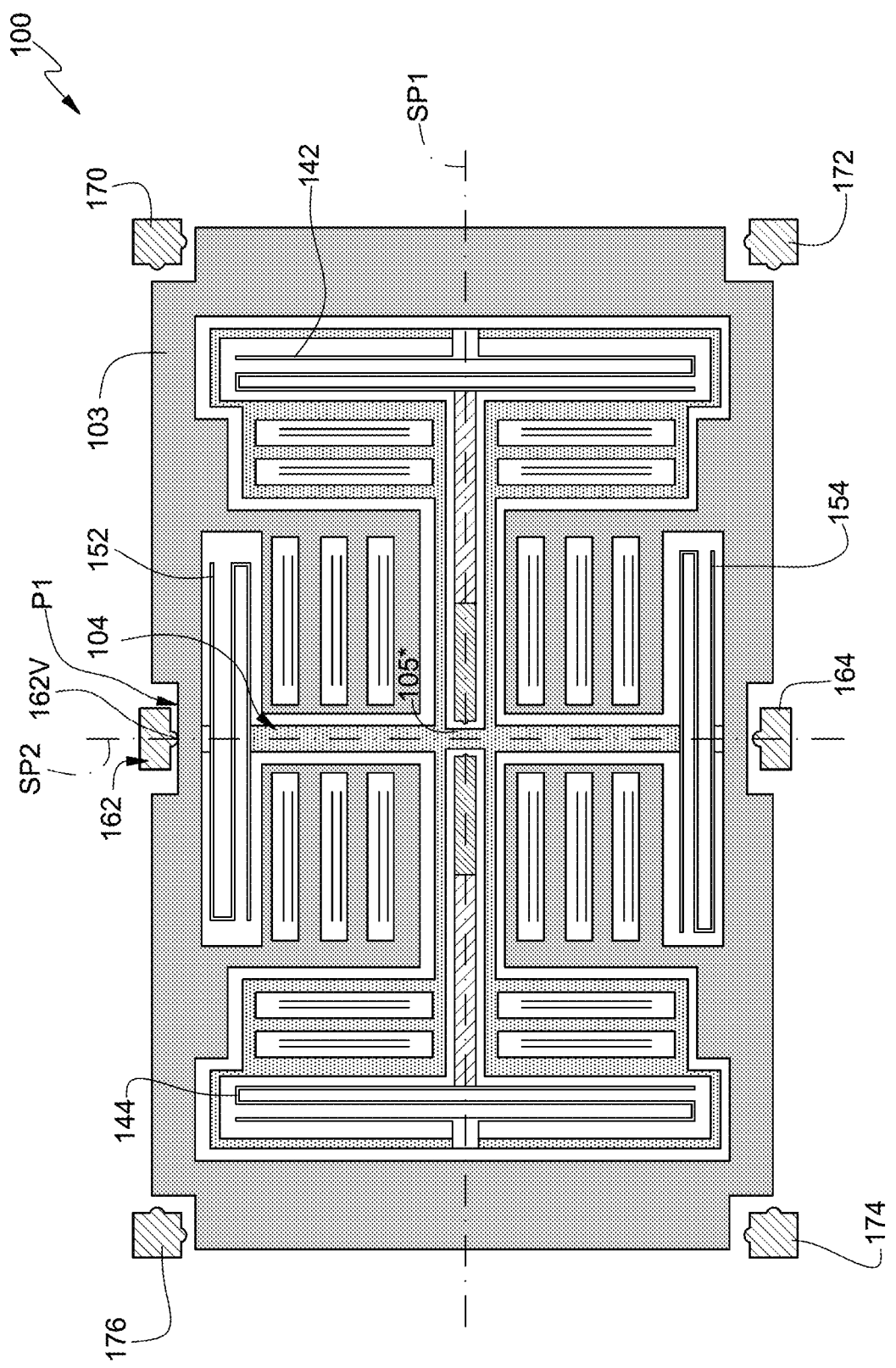
FIGS. 10 and 11 are schematic top views of the embodiment illustrated in FIGS. 6-7, when subjected to a second acceleration.
Figure 11:
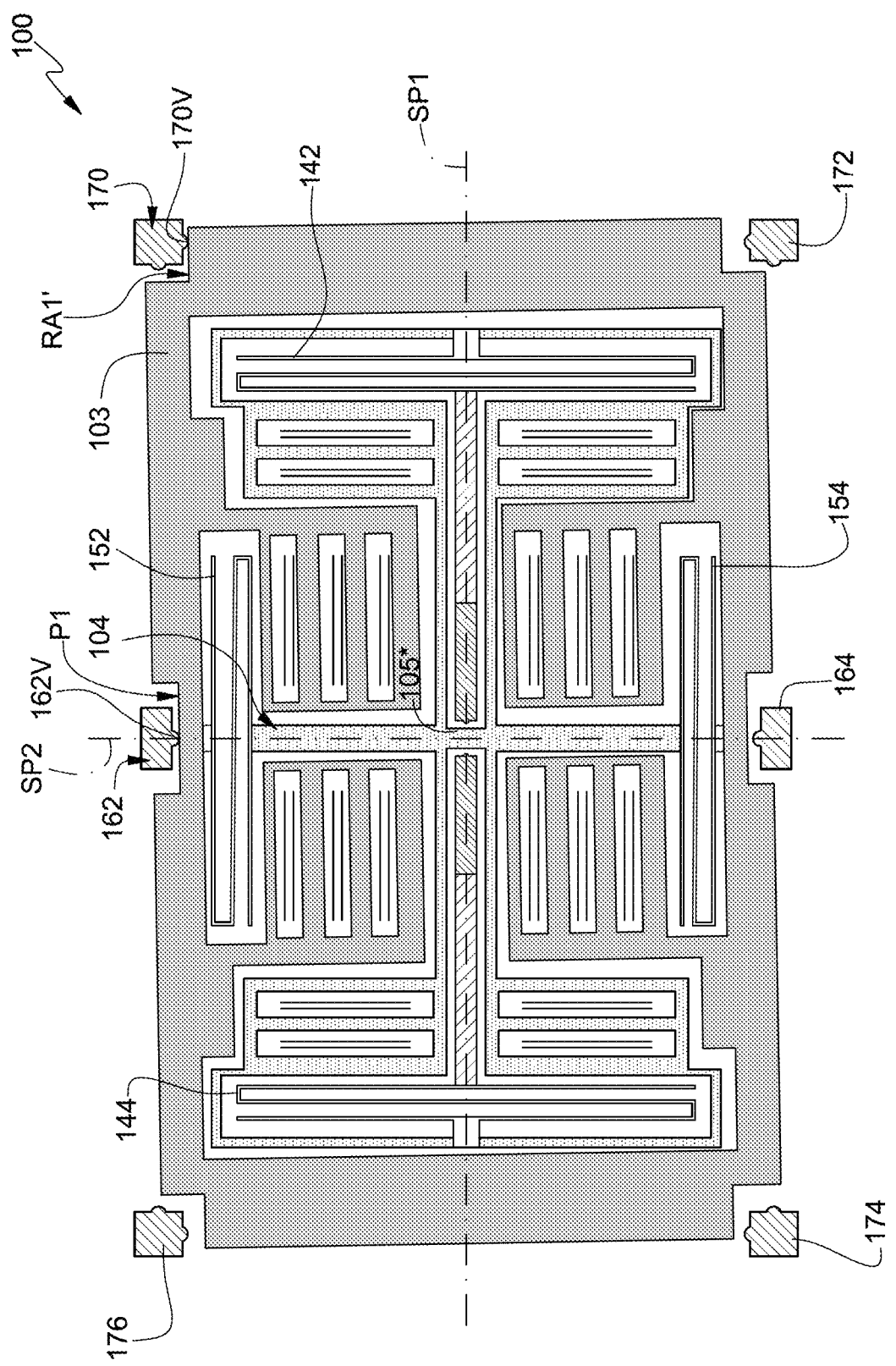

On the hypothesis of the modulus of the external acceleration $a_{ext}$ being sufficiently high, i.e., exceeding a corresponding first threshold value, translation proceeds until the first outer side wall P1 abuts against the projecting region 162V of the first external primary stopper element 162, which functions as center of rotation for the first inertial mass 103, as illustrated in FIG. 10. As regards the direction of rotation, the considerations presented in connection with FIG. 4 apply. For example, in what follows it is assumed that rotation occurs in the anticlockwise direction. Furthermore, if the modulus of the external acceleration $a_{ext}$ exceeds a corresponding second threshold value, higher than the corresponding first threshold value, rotation terminates when the first inertial mass 103 abuts against at least one of the first, second, third and fourth secondary stopper elements 170, 172, 174, 176. In this regard, in FIG. 11 it is assumed that the dimensions of the MEMS accelerometer 100 are such that the horizontal peripheral wall RA1' abuts against the first projecting region 170V.

The aforementioned rotation of just the first inertial mass 103 leads to an increase of the elastic potential energy stored in the third and fourth spring elements 152, 154, with consequent increase in the elastic return force $F_m$, and therefore reduction in the likelihood of the phenomenon of stiction occurring between the first inertial mass 103 and any one of the first, second, third, and fourth secondary stopper elements 170.

Similar considerations apply in the case (not illustrated) where the external acceleration $a_{ext}$, in addition to being directed parallel to the axis Y, has a direction concordant with the axis Y. In this case, if the modulus of the external acceleration $a_{ext}$ exceeds a corresponding first threshold value, rotation of the first inertial mass 103 occurs about the projecting region 164V of the second external primary stopper element 162. Moreover, if the modulus of the external acceleration $a_{ext}$ exceeds a corresponding second threshold value, and assuming that rotation occurs, for example, in the clockwise direction, rotation stops when the first inertial mass 103 abuts against the first projecting region 172V.

In practice, the first and second external primary stopper elements 162, 164 and the first, second, third and fourth secondary stopper elements 170, 172, 174, 176 form a first stopper structure, relative to the axis Y. Likewise, the first and second internal primary stopper elements 180, 182 and the first, second, third and fourth secondary stopper elements 170, 172, 174, 176 form a second stopper structure, relative to the axis X. In addition, in this embodiment, the first and second stopper structures share the first, second, third and fourth secondary stopper elements 170, 172, 174, 176. In this regard, in general, embodiments are possible in which the first inertial mass 103 stops against a secondary stopper element different from what has been described. In general, the secondary stopper element, upon which the first inertial mass 103 effectively abuts depends not only upon the direction of the acceleration and upon the direction of the subsequent rotation, but also upon the shape and arrangement of the first, second, third and fourth secondary stopper elements 170, 172, 174, 176, as well as upon the positioning of the axis of rotation and upon the shape of the first inertial mass 103, which may vary with respect to what has been described.

Irrespectively of the implementation details regarding arrest of rotation, the measurement of the external acceleration $a_{ext}$ may be made in a way similar to what has been described with reference to FIGS. 1A and 1B, and therefore on the basis of the values of the first and second variable capacitors $C_{X1}$, $C_{X2}$ present in the first additional openings 200, the capacitances of which vary in the presence of a non-zero component along X of the external acceleration $a_{ext}$, and of the first and second variable capacitors $C_{Y1}$, $C_{Y2}$ present in the second additional openings 202, the capacitances of which vary in the presence of a non-zero component along Y of the external acceleration $a_{ext}$. The sensing axes of the MEMS accelerometer 100 are parallel, respectively, to the axis X and to the axis Y and lie, respectively, in the first and second planes of symmetry SP1, SP2.

Figure 12:
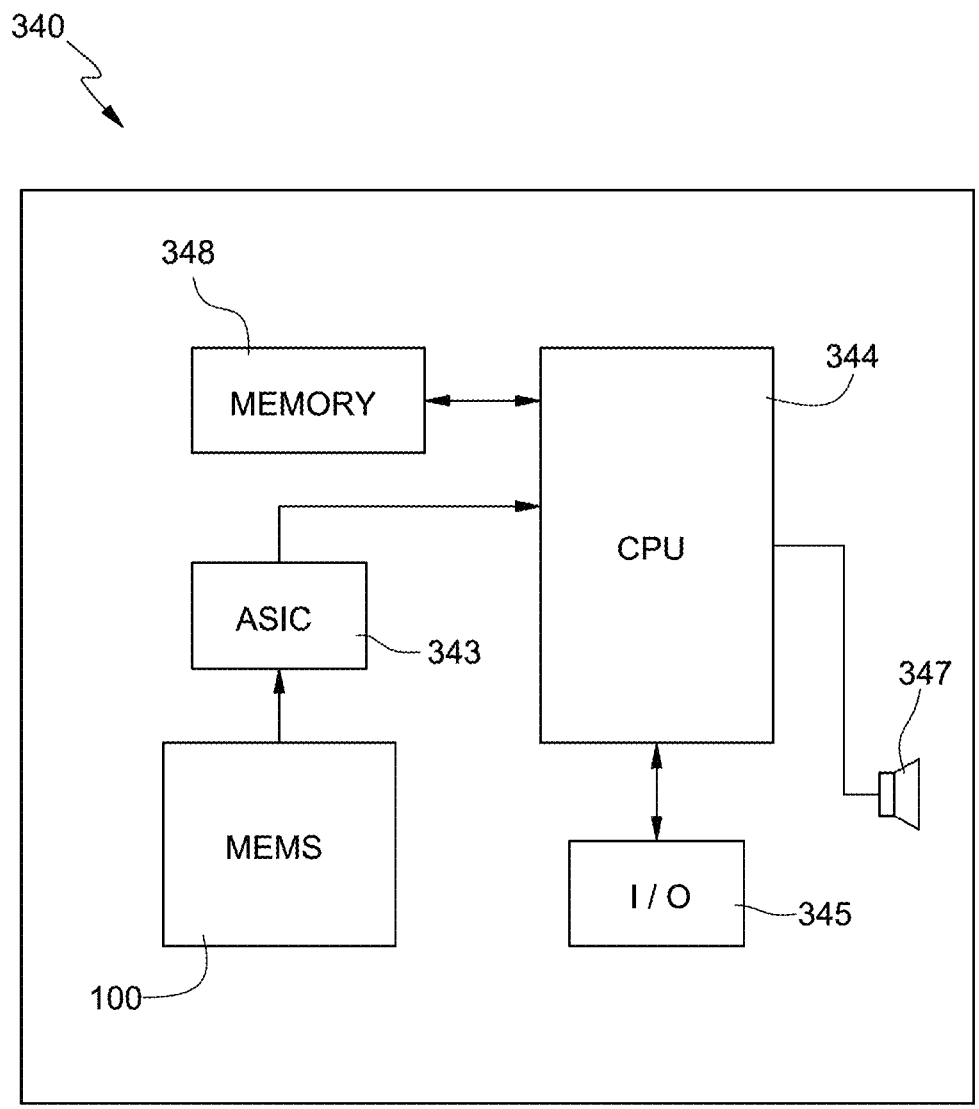
FIG. 12 shows a block diagram of an electronic apparatus incorporating a MEMS inertial sensor.

FIG. 12 shows an electronic apparatus 340 comprising the MEMS accelerometer 100.

The MEMS accelerometer 100 is connected to an ASIC 343 that provides the corresponding read interface; the ASIC 343 may be provided in the same die in which the MEMS accelerometer 100 is manufactured. In further embodiments (not illustrated), the ASIC 343 is manufactured in a separate die and housed in the same package as the MEMS accelerometer 100.

The electronic apparatus 340 is, for example, a portable mobile-communication apparatus, such as a mobile phone, a PDA (Personal Digital Assistant), a portable computer, a digital audio player with voice-recording capacity, a photographic video camera, or a controller for video games; in detail, the electronic apparatus 340 is generally able to process, store, and/or transmit and receive signals and information.

The electronic apparatus 340 further comprises a microprocessor 344, which receives the acceleration signals generated by the ASIC 343 as a function of the detections made by the MEMS accelerometer 100, and an input/output interface 345, for example equipped with a keypad and a screen, connected to the microprocessor 344. In addition, the electronic apparatus 340 comprises a speaker 347, for generating sounds on an audio output (not shown), and an internal memory 348, which are connected to the microprocessor 344.

The present MEMS inertial sensor has different advantages. In particular, the present MEMS inertial sensor enables reduction of the likelihood of the occurrence of the phenomenon of stiction, without leading to an increase in the overall dimensions or reducing the full scale of the device.

Finally, it is clear that modifications and variations may be made to the MEMS inertial sensor described and illustrated herein, without thereby departing from the scope of the present disclosure.

For instance, the present MEMS inertial sensor can function as gyroscope, or as inclinometer or as vibrometer.

The shapes of the projecting regions that define the axes of rotation may be different from what has been described. More in general, as mentioned previously, shapes and arrangements of the external and internal primary stopper elements may be different from what has been described; likewise, the shapes and arrangements of the secondary stopper elements may differ from what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS inertial sensor, comprising:
a supporting structure;
an inertial structure including a first inertial mass and a second inertial mass;
a first elastic structure mechanically coupled to the first inertial mass and to the supporting structure to enable a movement, with respect to the supporting structure, of the first inertial mass in a direction parallel to a first direction, when the supporting structure is subjected to a first acceleration parallel to said first direction;
a second elastic structure elastically coupled to the second inertial mass and to the supporting structure and configured to enable a movement, with respect to the supporting structure, of the second inertial mass in a direction parallel to a second direction, when the supporting structure is subjected to a second acceleration parallel to said second direction, the first elastic structure is mechanically interposed between the first and second inertial masses and is configured so that, when the supporting structure is subjected to said second acceleration, the first and second inertial masses translate in a fixed way in a direction parallel to said second direction, and the second elastic structure is configured so that, when the supporting structure is subjected to said first acceleration, the second inertial mass remains substantially fixed with respect to the supporting structure; and a first stopper structure fixed with respect to the supporting structure and including at least one first primary first-axis stopper element and one first secondary first-axis stopper element, wherein the first primary first-axis stopper element is configured so that, if said first acceleration exceeds a first threshold value, the first inertial mass abuts against the first primary first-axis stopper element and subsequently turns about a first axis of rotation defined by the first primary first-axis stopper element, and wherein the first secondary first-axis stopper element is configured so that, if said first acceleration exceeds a second threshold value higher than the first threshold value, the rotation of the first inertial mass terminates when the first inertial mass abuts against the first secondary first-axis stopper element.

2. The MEMS inertial structure according to claim 1, further comprising a second stopper structure fixed with respect to the supporting structure and including at least one first primary second-axis stopper element and a first secondary second-axis stopper element, wherein the first primary second-axis stopper element is configured so that, if said second acceleration exceeds a third threshold value, the second inertial mass abuts against the first primary second-axis stopper element and subsequently turns, in a way fixed with the first inertial mass, about a second axis of rotation defined by the first primary second-axis stopper element, and wherein the first secondary second-axis stopper element is configured so that, if said second acceleration exceeds a fourth threshold value higher than the third threshold value, the rotation of the first and second inertial masses in a way fixed terminates when the second inertial mass abuts against the first secondary second-axis stopper element.

3. The MEMS inertial sensor according to claim 2, wherein the first stopper structure further comprises a second primary first-axis stopper element and a second secondary first-axis stopper element, wherein the second primary first-axis stopper element is configured so that, when the supporting structure is subjected to a third acceleration having a direction opposite to the first acceleration and higher than a fifth threshold value, the first inertial mass abuts against the second primary first-axis stopper element and subsequently turns about a third axis of rotation defined by the second primary first-axis stopper element, and wherein the second secondary first-axis stopper element is configured so that, if said third acceleration exceeds a sixth threshold value higher than the fifth threshold value, the rotation of the first inertial mass about said third axis of rotation terminates when the first inertial mass abuts against the second secondary first-axis stopper element.

4. The MEMS inertial sensor according to claim 3, wherein the second stopper structure further comprises a second primary second-axis stopper element and a second secondary second-axis stopper element, wherein the second primary second-axis stopper element is configured so that, when the supporting structure is subjected to a fourth acceleration having a direction opposite to the second acceleration and higher than a seventh threshold value, the second inertial mass abuts against the second primary second-axis stopper element and subsequently turns, in a way fixed with the first inertial mass, about a fourth axis of rotation defined by the second primary second-axis stopper element, and wherein the second secondary second-axis stopper element is configured so that, if said fourth acceleration exceeds an eighth threshold value higher than the seventh threshold value, the rotation of the first and second inertial masses in a way fixed terminates when the second inertial mass abuts against the second secondary second-axis stopper element.

5. The MEMS inertial sensor according to claim 4, wherein the first inertial mass is traversed by a main opening, wherein the second inertial mass and the first elastic structure extend within the main opening, and wherein the first elastic structure comprises a pair of elastic elements, which, in resting conditions, are symmetrical with respect to a first plane of symmetry parallel to said second direction, each elastic element of said pair being fixed to the first inertial mass and to the second inertial mass, with the second inertial mass interposed between the elastic elements of said pair.

6. The MEMS inertial sensor according to claim 5, wherein the second inertial mass is traversed by a first and a second secondary opening, wherein the supporting structure comprises a first and a second anchorage region, which are symmetrical with respect to a second plane of symmetry parallel to said first direction and extend in part within the first and the second secondary openings, respectively, and wherein the second elastic structure comprises a respective first elastic element and a respective second elastic element, which, in resting conditions, are symmetrical with respect to the second plane of symmetry and extend, respectively, in the first and i-n-the-second secondary openings, the first elastic element of the second elastic structure being fixed to the first anchorage region and to the second inertial mass, the second elastic element of the second elastic structure being fixed to the second anchorage region and to the second inertial mass.

7. The MEMS inertial sensor according to claim 6, wherein the first and second primary first-axis stopper elements extend on an outside of the first inertial mass and each of the first and second primary first-axis stopper elements comprise a corresponding projecting region, facing the first inertial mass, the projecting region of the first primary first-axis stopper element defining said first axis of rotation, the projecting region of the second primary first-axis stopper element defining said third axis of rotation.

8. The MEMS inertial sensor according to claim 7, wherein the first and second primary second-axis stopper elements extend in part within the first and second secondary openings, respectively, and, in resting conditions, are arranged symmetrically with respect to a central portion of the second inertial mass, said first and second primary second-axis stopper elements having projecting shapes and defining the second and fourth axes of rotation, respectively.

9. The MEMS inertial sensor according to claim 8, wherein the first and second primary second-axis stopper elements are fixed, respectively, to the first and second anchorage regions.

10. The MEMS inertial sensor according to claim 8, wherein the first and second secondary first-axis stopper elements and the first and second secondary second-axis stopper elements are arranged on the outside of the first inertial mass.

11. A MEMS inertial sensor, comprising:
a supporting structure;
an inertial structure including a first inertial mass and a second inertial mass;
a first elastic structure mechanically coupled to the first inertial mass and to the supporting structure to enable a movement, with respect to the supporting structure, of the first inertial mass in a direction parallel to a first direction, when the supporting structure is subjected to a first acceleration parallel to said first direction;
a second elastic structure elastically coupled to the second inertial mass and to the supporting structure and configured to enable a movement, with respect to the supporting structure, of the second inertial mass in a direction parallel to a second direction, when the supporting structure is subjected to a second acceleration parallel to said second direction, the first elastic structure is mechanically interposed between the first and second inertial masses and is configured so that, when the supporting structure is subjected to said second acceleration, the first and second inertial masses translate in a fixed way in a direction parallel to said second direction, and the second elastic structure is configured so that, when the supporting structure is subjected to said first acceleration, the second inertial mass remains substantially fixed with respect to the supporting structure;
a first stopper structure fixed with respect to the supporting structure and including at least one first primary first-axis stopper element and one first secondary first-axis stopper element, the first pirimary first-axis stopper element is configured so that, if said first acceleration exceeds a first threshold value, the first inertial mass abuts against the first primary first-axis stopper element and subsequently turns about a first axis of rotation defined by the first primary first-axis stopper element, the first secondary first-axis stopper element is configured so that, if said first acceleration exceeds a second threshold value higher than the first threshold value, the rotation of the first inertial mass terminates when the first inertial mass abuts against the first secondary first-axis stopper element;
a main-axis electrode fixed with respect to the supporting structure and capacitively coupled to the first inertial mass to form a corresponding main-axis capacitor, the capacitance of which is indicative of said first acceleration; and
a transverse-axis electrode fixed with respect to the supporting structure and capacitively coupled to the second inertial mass to form a corresponding transverse-axis capacitor, the capacitance of which is indicative of said second acceleration.

12. The MEMS inertial structure according to claim 11, further comprising a second stopper structure fixed with respect to the supporting structure and including at least one first primary second-axis stopper element and a first secondary second-axis stopper element,
wherein the first primary second-axis stopper element is configured so that, if said second acceleration exceeds a third threshold value, the second inertial mass abuts against the first primary second-axis stopper element and subsequently turns, in a way fixed with the first inertial mass, about a second axis of rotation defined by the first primary second-axis stopper element, and
wherein the first secondary second-axis stopper element is configured so that, if said second acceleration exceeds a fourth threshold value higher than the third threshold value, the rotation of the first and second inertial masses in a way fixed terminates when the second inertial mass abuts against the first secondary second-axis stopper element.

13. The MEMS inertial structure according to claim 12, wherein the first stopper structure further comprises a second primary first-axis stopper element and a second secondary first-axis stopper element,
wherein the second primary first-axis stopper element is configured so that, when the supporting structure is subjected to a third acceleration having a direction opposite to the first acceleration and higher than a fifth threshold value, the first inertial mass abuts against the second primary first-axis stopper element and subsequently turns about a third axis of rotation defined by the second primary first-axis stopper element, and
wherein the second secondary first-axis stopper element is configured so that, if said third acceleration exceeds a sixth threshold value higher than the fifth threshold value, the rotation of the first inertial mass about said third axis of rotation terminates when the first inertial mass abuts against the second secondary first-axis stopper element.

14. An electronic device, comprising:
a MEMS inertial sensor, including:
a supporting structure;
an inertial structure including a first inertial mass and a second inertial mass;
a first elastic structure mechanically coupled to the first inertial mass and to the supporting structure to enable a movement, with respect to the supporting structure, of the first inertial mass in a direction parallel to a first direction, when the supporting structure is subjected to a first acceleration parallel to said first direction;
a second elastic structure elastically coupled to the second inertial mass and to the supporting structure and configured to enable a movement, with respect to the supporting structure, of the second inertial mass in a direction parallel to a second direction, when the first elastic structure is mechanically interposed between the first and second inertial masses and is configured so that, when the supporting structure is subjected to said second acceleration, the first and second inertial masses translate in a fixed way in a direction parallel to said second direction, and the second elastic structure is configured so that, when the supporting structure is subjected to said first acceleration, the second inertial mass remains substantially fixed with respect to the supporting structure; and
a first stopper structure fixed with respect to the supporting structure and including at least one first primary first-axis stopper element and one first secondary first-axis stopper element,
wherein the first primary first-axis stopper element is configured so that, if said first acceleration exceeds a first threshold value, the first inertial mass abuts against the first primary first-axis stopper element and subsequently turns about a first axis of rotation defined by the first primary first-axis stopper element, and wherein the first secondary first-axis stopper element is configured so that, if said first acceleration exceeds a second threshold value higher than the first threshold value, the rotation of the first inertial mass terminates when the first inertial mass abuts against the first secondary first-axis stopper element;

an ASIC coupled to the MEMS inertial sensor; and a processing unit coupled to the ASIC.

15. The electronic device according to claim 14, wherein the MEMS inertial sensor further includes a second stopper structure fixed with respect to the supporting structure and including at least one first primary second-axis stopper element and a first secondary second-axis stopper element, wherein the first primary second-axis stopper element is configured so that, if said second acceleration exceeds a third threshold value, the second inertial mass abuts against the first primary second-axis stopper element and subsequently turns, in a way fixed with the first inertial mass, about a second axis of rotation defined by the first primary second-axis stopper element, and wherein the first secondary second-axis stopper element is configured so that, if said second acceleration exceeds a fourth threshold value higher than the third threshold value, the rotation of the first and second inertial masses in a way fixed terminates when the second inertial mass abuts against the first secondary second-axis stopper element.

16. The electronic device according to claim 15, wherein the first stopper structure further comprises a second primary first-axis stopper element and a second secondary first-axis stopper element, wherein the second primary first-axis stopper element is configured so that, when the supporting structure is subjected to a third acceleration having a direction opposite to the first acceleration and higher than a fifth threshold value, the first inertial mass abuts against the second primary first-axis stopper element and subsequently turns about a third axis of rotation defined by the second primary first-axis stopper element, and wherein the second secondary first-axis stopper element is configured so that, if said third acceleration exceeds a sixth threshold value higher than the fifth threshold value, the rotation of the first inertial mass about said third axis of rotation terminates when the first inertial mass abuts against the second secondary first-axis stopper element.

17. The electronic device according to claim 16, wherein the second stopper structure further comprises a second primary second-axis stopper element and a second secondary second-axis stopper element, wherein the second primary second-axis stopper element is configured so that, when the supporting structure is subjected to a fourth acceleration having a direction opposite to the second acceleration and higher than a seventh threshold value, the second inertial mass abuts against the second primary second-axis stopper element and subsequently turns, in a way fixed with the first inertial mass, about a fourth axis of rotation defined by the second primary second-axis stopper element, and wherein the second secondary second-axis stopper element is configured so that, if said fourth acceleration exceeds an eighth threshold value higher than the seventh threshold value, the rotation of the first and second inertial masses in a way fixed terminates when the second inertial mass abuts against the second secondary second-axis stopper element.

* * * * *

UNITED STATES PATENT AND TRADEMARK OFFICE
CERTIFICATE OF CORRECTION

PATENT NO. : 11,519,932 B2
APPLICATION NO. : 17/192465
DATED : December 6, 2022
INVENTOR(S) : Francesco Rizzini et al.

Page 1 of 1

It is certified that error appears in the above-identified patent and that said Letters Patent is hereby corrected as shown below:

In the Claims

In Column 18, Claim 6, Lines 44-45:
"and i-n-the-second secondary" should read: --and second secondary--.

In Column 19, Claim 11, Line 41:
"first pirimary" should read: --first primary--.

In Column 20, Claim 14, Line 51:
"when the first elastic structure" should read: --when the supporting structure is subjected to a second acceleration parallel to said second direction, the first elastic structure--.

Signed and Sealed this
Thirty-first Day of January, 2023

Katherine Kelly Vidal
*Director of the United States Patent and Trademark Office*